United States Patent
Lin et al.

(10) Patent No.: US 8,338,960 B2
(45) Date of Patent: Dec. 25, 2012

(54) METHOD OF MANUFACTURING PHOTOMASK AND METHOD OF REPAIRING OPTICAL PROXIMITY CORRECTION

(75) Inventors: Ling-Chieh Lin, Taichung County (TW); Chien-Fu Lee, Taipei (TW); I-Hsiung Huang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/437,575

(22) Filed: Apr. 2, 2012

(65) Prior Publication Data
US 2012/0187571 A1 Jul. 26, 2012

Related U.S. Application Data

(63) Continuation of application No. 12/568,027, filed on Sep. 28, 2009, now Pat. No. 8,278,762, which is a continuation of application No. 11/559,107, filed on Nov. 13, 2006, now Pat. No. 7,617,475.

(51) Int. Cl.
*H01L 23/522* (2006.01)
(52) U.S. Cl. .................. 257/774; 257/E23.145
(58) Field of Classification Search .................. 257/758, 257/774, E23.145; 716/19
See application file for complete search history.

(56) References Cited

U.S. PATENT DOCUMENTS

| | | |
|---|---|---|
| 5,706,178 A | 1/1998 | Barrow |
| 5,879,844 A | 3/1999 | Yamamoto et al. |
| 6,077,310 A | 6/2000 | Yamamoto et al. |
| 6,189,136 B1 | 2/2001 | Bothra |
| 6,294,454 B1 | 9/2001 | Koike |
| 6,374,396 B1 | 4/2002 | Baggenstoss et al. |
| 6,420,077 B1 | 7/2002 | Chen et al. |
| 6,432,790 B1 | 8/2002 | Okamoto et al. |
| 6,465,894 B2 | 10/2002 | Koike |
| 6,563,127 B2 | 5/2003 | Lin et al. |
| 6,576,147 B2 | 6/2003 | Mukai |
| 6,677,623 B2 | 1/2004 | Koike |
| 6,704,695 B1 | 3/2004 | Bula et al. |
| 6,727,026 B2 | 4/2004 | Kuji et al. |
| 6,900,124 B1 | 5/2005 | Kim et al. |
| 6,952,818 B2 | 10/2005 | Ikeuchi |
| 6,988,259 B2 | 1/2006 | Pierrat et al. |
| 6,993,455 B2 | 1/2006 | Koehle et al. |
| 7,039,896 B2 | 5/2006 | Medvedeva et al. |
| 7,052,810 B2 | 5/2006 | Lu et al. |
| 7,065,738 B1 | 6/2006 | Kim |

(Continued)

OTHER PUBLICATIONS

Liu et al., "Combination of SCM/SSRM analysis and Nanoprobing technique for soft single bit failure analysis", Proceedings from the 30th International Symposium for Testing and Failure Analysis, Nov. 14-18, 2004, pp. 38-41.

(Continued)

*Primary Examiner* — Roy Potter
(74) *Attorney, Agent, or Firm* — J.C. Patents

(57) ABSTRACT

A method of manufacturing a photomask is described. The graphic data of the photomask are provided, and than an optical proximity correction is performed to the graphic data. A process rule check is then performed to the graphic data with the optical proximity correction. When at least one failed pattern not passing the process rule check is found in the graphic data, a repair procedure is performed only to the failed pattern so that the failed pattern can pass the process rule check. The patterns of the photomask are then formed according to the corrected and repaired graphic data.

13 Claims, 2 Drawing Sheets

U.S. PATENT DOCUMENTS

| | | | |
|---|---|---|---|
| 7,072,208 B2 | 7/2006 | Min et al. | |
| 7,180,318 B1 | 2/2007 | Mahoney et al. | |
| 7,259,052 B2 | 8/2007 | Murata et al. | |
| 7,275,227 B1 | 9/2007 | Ying | |
| 7,303,845 B2 | 12/2007 | Okada et al. | |
| 7,376,260 B2 | 5/2008 | Callan et al. | |
| 7,507,661 B2 | 3/2009 | Lingunis et al. | |
| 7,537,870 B2 | 5/2009 | Crouse et al. | |
| 7,594,199 B2 | 9/2009 | Socha et al. | |
| 7,598,005 B2 | 10/2009 | Yamamoto | |
| 7,632,610 B2 | 12/2009 | Wallace et al. | |
| 7,962,868 B2 | 6/2011 | Lucas et al. | |
| 2002/0108098 A1 | 8/2002 | Igeta | |
| 2004/0241945 A1 | 12/2004 | Abbott | |
| 2005/0167700 A1 | 8/2005 | Abbott | |
| 2005/0275043 A1 | 12/2005 | Huang et al. | |
| 2006/0044280 A1 | 3/2006 | Huddleston et al. | |
| 2006/0291649 A1 | 12/2006 | Crandall et al. | |
| 2007/0023832 A1 | 2/2007 | Matsui | |
| 2007/0284748 A1* | 12/2007 | Woo et al. | 257/758 |

OTHER PUBLICATIONS

Nakai et al., "A 65 nm CMOS Technology with a High-Performance and Low-Leakage Transistor, a 0.55 µm2 6T-SRAM Cell and Robust Hybrid-ULK/Cu Interconnects for Mobile Multimedia Applications", IEEE International Electron Devices Meeting, Dec. 8-10, 2003, pp. 11.3.1-11.3.4.

Jung et al., "A Novel 0.79µm2 SRAM Cell by KrF Lithography and High performance 90nm CMOS Technology for Ultra High Speed SRAM", IEEE International Electron Devices Meeting, 2002, pp. 419-422.

Craig et al., "Robust Methodology for State of the Art Embedded SRAM Bitcell Design", Proc. SPIE, Mar. 6, 2002, pp. 1-10.

Okuno et al, "45-nm Node CMOS Integration with a Novel STI Structure and Full-NCS/Cu Interlayers for Low-Operation-Power (LOP) Applications", IEEE International Electron Devices Meeting, Dec. 5, 2005, pp. 1-5.

* cited by examiner

METHOD OF MANUFACTURING PHOTOMASK AND METHOD OF REPAIRING OPTICAL PROXIMITY CORRECTION

CROSS-REFERENCE TO RELATED APPLICATION

This is a continuation application (CA) of and claims priority benefit of patent application Ser. No. 12/568,027 filed on Sep. 28, 2009, which was a continuation application (CA) of and claimed priority benefit of patent application Ser. No. 11/559,107 filed on Nov. 13, 2006. The entirety of each of the above-mentioned patent applications is hereby incorporated by reference herein and made a part of this specification.

BACKGROUND OF THE INVENTION

1. Field of Invention

This invention relates to a manufacturing method of a tool used in an integrated circuit (IC) process, and more particularly to a method of manufacturing a photomask and a method of repairing an optical proximity correction (OPC) to the graphic data of a photomask.

2. Description of Related Art

After the linewidth of IC process drops to the deep sub-micro level, the control on the critical dimension (CD) of each patterned layer of an integrated circuit becomes more and more important. When the linewidth drops to one half or less of the wavelength of the light source for exposure, optical proximity correction is required for the patterns of the photomask to reduce the deviation of the critical dimension. The optical proximity correction includes, for example, adding serifs or a hammerhead at an end of a bar-like pattern, making protrusions and indents at the edges of a pattern, adding an assist line beside a pattern, and so forth.

In the conventional method of manufacturing a photomask with OPC, an OPC recipe is applied to correct the patterns in the graphic data of the photomask after the graphic patterns are provided, and then the graphic data with OPC is subjected to a process rule check (PRC), which utilizes computer simulations to predict whether the patterns transferred onto the wafer meet the requirements of the process or not. If one or more patterns cannot pass the process rule check, another OPC recipe is applied to correct all patterns in the original graphic data, and then another process rule check is performed. However, for the graphic data system (GDS) file of a photomask used in advanced IC processes easily has a size up to hundreds of gigabytes, the conventional method is quite time-consuming.

SUMMARY OF THE INVENTION

Accordingly, this invention provides a method of repairing optical proximity correction (OPC), which adjusts only the failed patterns that cannot pass the PRC.

This invention also provides a method of manufacturing a photomask, which utilizes the above OPC repairing method of this invention to shorten the period needed for manufacturing the photomask.

According to an embodiment, the method of manufacturing a photomask of this invention may include the following steps, the photomask being used in an integrated circuit (IC) process to define a first patterned layer of the IC. The graphic data of the photomask are provided, and then an optical proximity correction is performed to the graphic data. A process rule check is then performed to the graphic data with the OPC. When at least one failed pattern not passing the process rule check is found, a repair procedure is performed only to the failed pattern so that the failed pattern can pass the process rule check. The patterns of the photomask are then formed according to the corrected and repaired graphic data that have been subjected to the OPC and the repair.

In an embodiment, the repair procedure includes the steps below. The graphic data of parts of an upper patterned layer and a lower patterned layer that are respectively over and under the first patterned layer in the integrate circuit and relate to the first patterned layer are retrieved, wherein the parts of the upper and lower patterned layers correspond to the failed pattern. The arrangement of at least one adjacent pattern neighboring to the failed pattern in the integrated circuit is check, and then a critical dimension and/or a position of the failed pattern is adjusted based on the graphic data of the parts of the upper and lower patterned layers and the arrangement of the at least one adjacent pattern. The adjustment to the critical dimension preferably does not exceed 30% thereof. It is particularly noted that the term "and/or" means "and" or "or" in the whole specification and the claims of this invention.

In an embodiment, in adjusting the critical dimension and/or the position of the failed pattern, a distance between calculated projection contours of the failed pattern and the at least one adjacent pattern may be considered. When there is a plurality of adjacent patterns, the distances at all angles between the calculated projection contour of the failed pattern and those of the adjacent patterns may be considered. When the graphic data includes a plurality of contact hole patterns, the adjustment to a critical dimension of a failed contact hole pattern not passing the process rule check may include increasing the x-directional critical dimension thereof but decreasing the y-directional one thereof, or increasing the y-directional critical dimension thereof but decreasing the x-directional one thereof. The adjustment to the x- or y-directional critical dimension is preferably within the range of ±30% thereof. The upper and lower patterned layers each may include a plurality of conductive lines.

In an embodiment, the IC process may further include using another photomask to form a second patterned layer at the same level of the first patterned layer of the integrated circuit, wherein the at least one adjacent pattern includes a part of the second patterned layer. The repair procedure may further include retrieving the graphic data of the part of the second patterned layer for deriving the arrangement of the at least one adjacent pattern. In adjusting the critical dimension and/or the position of the failed pattern, a distance between calculated projection contours of the failed pattern and the at least one adjacent pattern may be considered. When there is a plurality of adjacent patterns, the distances at all angles between the calculated projection contour of the failed pattern and those of the adjacent patterns may be considered.

In one embodiment, the first patterned layer has a plurality of S/D contact holes therein, the graphic data of the photomask include a plurality of S/D contact hole patterns, the lower patterned layer includes a plurality of active areas, the upper patterned layer includes a plurality of interconnect lines, and the second patterned layer includes a plurality of gates. The adjustment to a critical dimension of an S/D contact hole pattern not passing the process rule check may include increasing the x-directional critical dimension thereof but decreasing the y-directional one thereof, or increasing the y-directional critical dimension thereof but decreasing the x-directional one thereof. The adjustment to the x- or y-directional critical dimension is preferably within the range of ±30% thereof.

In a preferred embodiment, the method of repairing optical proximity correction of this invention is applied to the graphic data of a photomask with OPC, wherein the photomask is used in an IC process to define a patterned layer of the IC and the graphic data include at least one failed pattern not passing a process rule check. The method includes the following steps. The graphic data of parts of an upper patterned layer and a lower patterned layer that are respectively on and over the patterned layer and related to the pattern layer are retrieved, wherein the parts of the upper and lower patterned layers correspond to the failed pattern. The arrangement of at least one adjacent pattern neighboring to the failed pattern in the integrated circuit is checked, and then a critical dimension and/or a position of the failed pattern is adjusted based on the graphic data of the parts of the upper and lower patterned layers and a distance between the calculated projection contours of the failed pattern and the at least one adjacent pattern.

Since the photomask manufacturing method of this invention performs a repair procedure only to the failed patterns not passing the process rule check but not adjust all patterns with another OPC recipe, the design of the photomask can be simplified to shorten the period needed for manufacturing the photomask. Additionally, in an embodiment where a critical dimension and/or a position of a failed pattern are adjusted in the repair procedure, the process margin is increased to improve the product yield.

In order to make the aforementioned and other objects, features and advantages of the present invention comprehensible, a preferred embodiment accompanied with figures is described in detail below.

DESCRIPTION OF EMBODIMENTS

Figure 1:
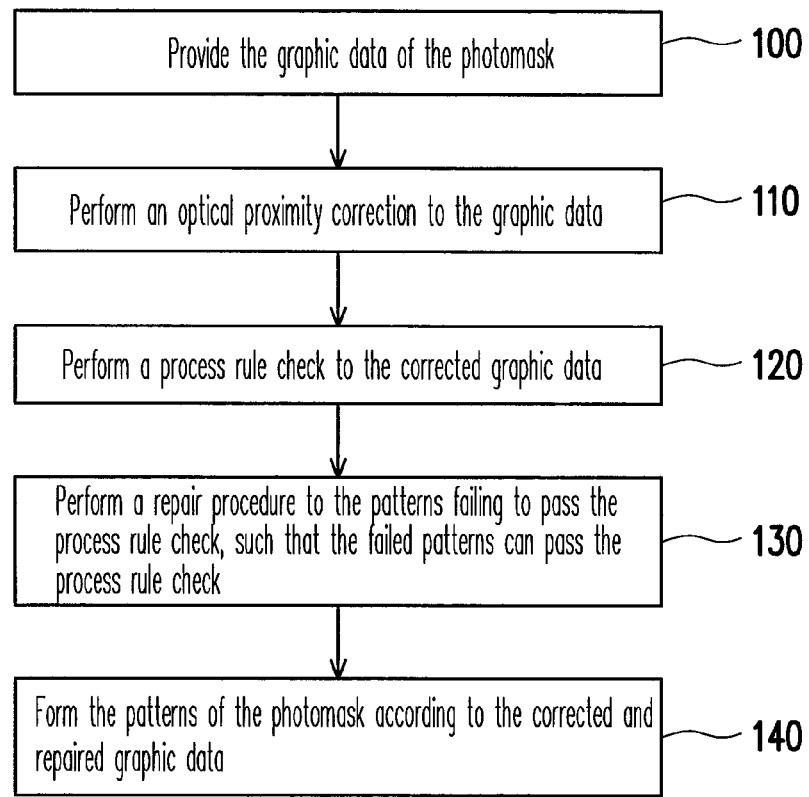
FIG. 1 shows a flow chart of a photomask manufacturing method according to an embodiment of this invention.

FIG. 1 shows a flow chart of a photomask manufacturing method according to an embodiment of this invention. The photomask is used in an IC process for defining a patterned layer of the integrated circuit, and the patterned layer may be a dielectric layer having contact holes therein or may include conductive lines. At first, the graphic data of the photomask are provided in step 100, possibly made by an IC designer and stored in a GDS file. Optical proximity correction is then performed to the graphic data in step 110, which may include adding serifs at four corners of a contact hole pattern or adding a hammerhead at an end of a conductive line pattern.

In next step 120, a process rule check is performed to the graphic data with OPC. The process rule check mainly include a lithography rule check (LRC) and a design rule check (DRC). The LRC usually includes using numerical integration of a convolution formula to derive the contours of the photomask patterns projected onto the photoresist layer, so as to check if there is any location beyond the lithographic resolution where adjacent patterns are merged in mistake or a single pattern is broken. A design rule check usually includes predicting whether the patterns transferred onto the wafer can meet the requirements of the circuit design or not, according to the above calculated projection contours of the patterns and the variables in etching and alignment. The requirements include, for example, sufficient widths for conductive lines, sufficient cross-sectional areas for contact plugs, sufficient overlap areas between conductive lines and contact plugs, prevention of erroneous connection between adjacent patterns due to insufficient etching margin, and so forth. In a case where another photomask is used to define patterns that are at the same level of the patterns defined by the photomask to be manufactured, the requirements may also include prevention of erroneous connection between the patterns defined by the different photomasks due to insufficient alignment/etching margin.

An example of adjacent patterns being connected in error due to an insufficient etching margin is that adjacent contact holes are connected due to an insufficient margin of the etching process for defining the contact holes. An example of patterns defined by different photomasks at the same level of an integrated circuit being connected in error due to insufficient alignment/etching margin is that a source/drain contact hole exposes a part of a gate due to an insufficient alignment margin of the exposure process and/or an insufficient margin of the etching process. The later two embodiments of this invention are OPC repairing procedures for the above cases of erroneous connection between adjacent patterns, intended to further explain this invention.

In next step 130, a repair procedure is performed only to the patterns failing to pass the process rule check so that each failed pattern can pass the process rule check. The repair procedure for a failed pattern may include the following steps. The graphic data of parts of an upper patterned layer and a lower patterned layer relating to the target patterned layer are retrieved, wherein the upper patterned layer and the lower patterned layer are respectively on and under the target patterned layer and the parts of the two related layers correspond to the failed pattern. Then, the arrangement of at least one adjacent pattern neighboring to the failed pattern in the integrated circuit is checked. A critical dimension and/or the position of the failed pattern is adjusted based on the graphic data of the parts of the upper and the lower patterned layers as well as the arrangement of the at least one adjacent pattern, wherein the adjustment to the critical dimension usually does not exceed 30% thereof.

In adjusting the critical dimension and/or the position of the failed pattern, it is preferred to consider the distance between the calculated projection contours of the failed pattern and the at least one adjacent pattern. If there is more than one adjacent patterns neighboring to the failed pattern in the integrated circuit, it is preferred to consider the distances at all angles between the calculated projection contour of the failed pattern and those of the adjacent patterns.

Thereafter, the patterns of the photomask are formed according to the corrected and repaired graphic data that have been subjected to the OPC and the repair procedure (step 140), which may be done with the follow steps. A photoresist layer is formed on an opaque layer on a glass substrate, and then an electron beam is used to form latent patterns in the photoresist layer under the control of a computer that is installed with the corrected and repaired graphic data. Then, development, etching, photoresist removal and cleaning are sequentially performed to finish the fabrication of the photomask.

Figure 2:
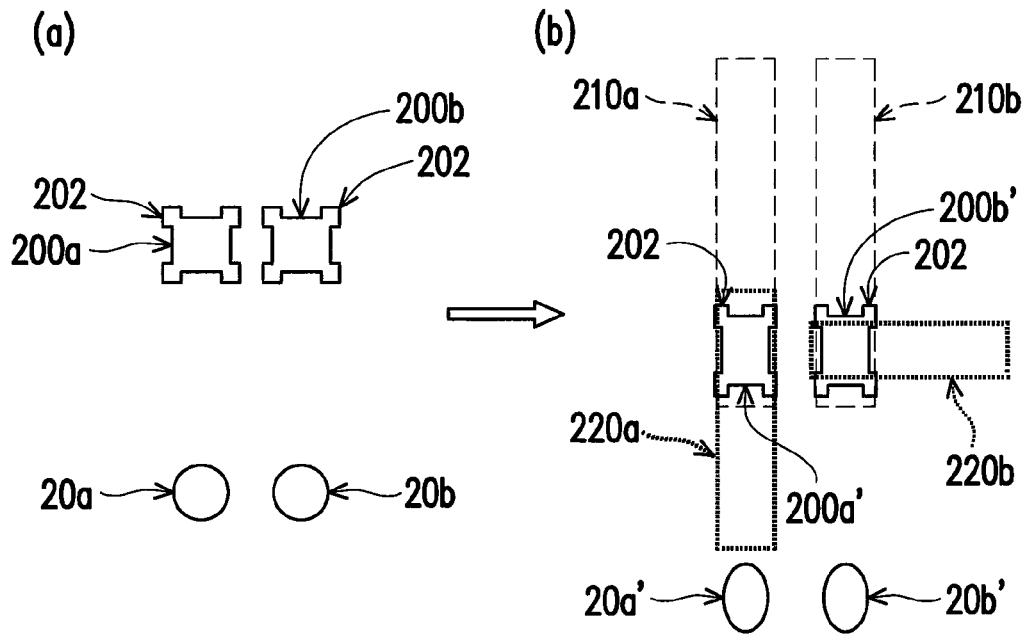
FIG. 2 illustrates an OPC repairing procedure according to an embodiment of this invention.

FIG. 2 illustrates an OPC repairing procedure according to an embodiment of this invention, which is applied to after-OPC contact hole patterns for defining contact holes in an interconnect process. Referring to FIG. 2A, two adjacent contact hole patterns 200a and 200b have been subjected to an OPC that added four serifs 202 respectively at four corners of each contact hole pattern 200a/b. In the subsequent process rule check, the projected contours 20a and 20b of the two corrected contact hole patterns 200a and 200b are obtained through numerical integration of a convolution formula, wherein the calculated projection contour of each contact hole pattern 200a/b is near circular for the pattern is near square.

For the projection contours 20a and 20b are not connected with each other, the contact hole patterns 200a and 200b pass the lithography rule check as a part of the process rule check. However, in the design rule check that considers the variables in the etching, it is predicted that the two corresponding contact holes formed through etching are possibly connect with each other due to an insufficient etching margin to make the contact plugs formed later shorted. Hence, at least one of the two contact hole patterns 200a and 200b has to be considered as a failed pattern, of which a critical dimension and/or a position has to be adjusted to increase the etching margin.

Referring to FIG. 2(*a*)/(*b*), the repair procedure of this embodiment is as follows. The upper and lower patterned layers relating to the patterned layer with contact holes therein respectively include upper conductive lines and lower conductive lines that are coupled via the contact plugs in the contact holes, and the parts of the upper and lower conductive lines corresponding to the contact hole patterns 200a and 200b include two lower conductive lines 210a and 210b and two upper conductive lines 220a and 220b. Hence, the graphic data of the parts of the two lower conductive lines 210a and 210b and the two upper conductive lines 220a and 220b are retrieved, wherein the upper conductive line 220b is orientated in the x-direction and the other conductive lines 210a, 210b and 220a in the y-direction.

Then, under the limitation that the overlap area of each contact plug (corresponding to 200a or 200b) with each of the upper and lower conductive lines (corresponding to 210a and 220a, or 210b and 220b) connected thereto has to be within a certain range for sufficiently low resistance, the x-directional critical dimension of each of the contact hole patterns 200a and 200b is decreased to increase the etching margin, while the y-directional critical dimension of the same is increased to maintain the cross-sectional area of the contact plug for sufficiently low resistance. The decrease in the x-directional critical dimension usually does not exceed 30% thereof, preferably 15% thereof. The increase in the y-directional critical dimension usually does not exceed 30% thereof, preferably 15% there of. Consequently, two corrected and repaired contact hole patterns 200a' and 200b' are obtained. Since each of the contact hole patterns 200a' and 200b' is near rectangular, it has a near elliptic projection contour 20a'/b' on the wafer.

In addition, in a case where the above line-contact-line interconnect structure is rotated by 90° so that the two contact hole patterns are arranged in the y-direction, the y-directional critical dimension has to be decreased while the x-directional one has to be increased for the same reasons mentioned above. Moreover, though the two contact hole patterns 200a and 200b are both adjusted in the shape while their centers are not shifted in the above embodiment, it is possible to adjust the shape of only one of them and/or shift the center of at least one of them when the arrangement of the upper and lower conductive lines is changed, so that good connections between the contact plugs and the upper/lower conductive lines and a larger etching margin for adjacent contact holes are achieved simultaneously.

Figure 3A:
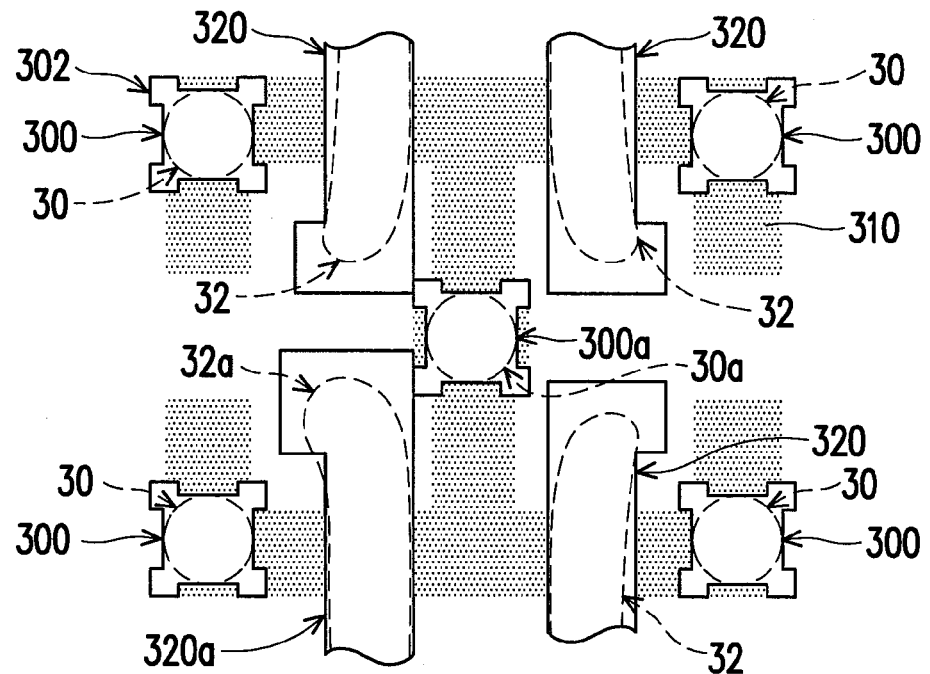
FIGS. 3A and 3B illustrate an OPC repairing procedure according to another embodiment of this invention.
Figure 3B:
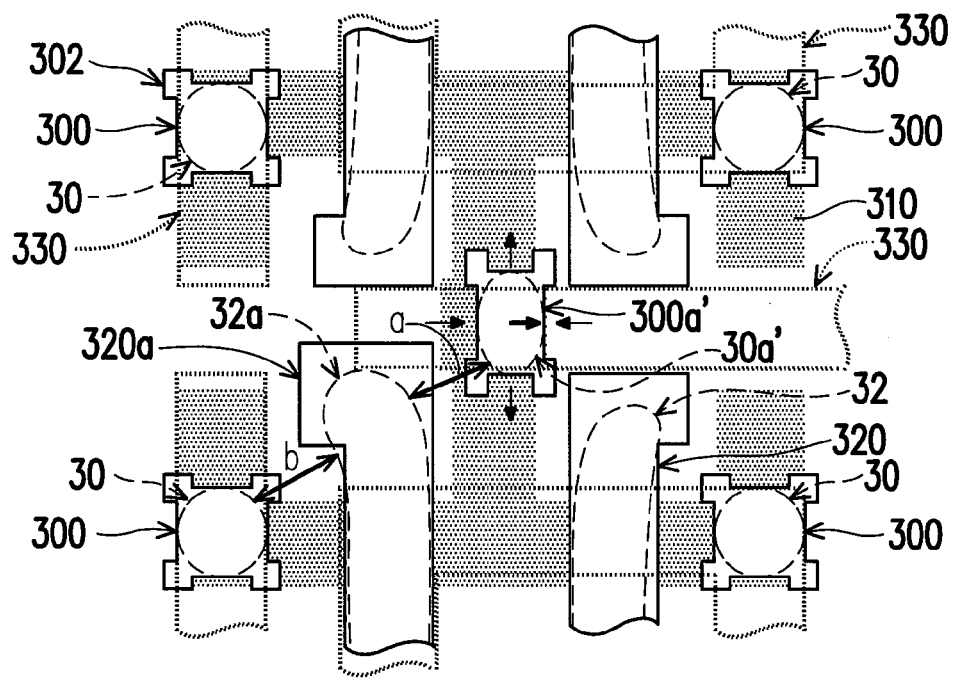

FIGS. 3A and 3B illustrate an OPC repairing procedure according to another embodiment of this invention, which is applied to after-OPC S/D contact hole patterns for defining contact holes in a static random access memory (SRAM) process.

Referring to FIG. 3A, the local layout structure of SRAM includes five contact plugs and four gate lines, wherein the contact holes containing the five contact plugs are defined by five contact hole patterns 300 on a photomask and the gate lines by four gate line patterns 320 on another photomask. An end of each gate line pattern 320 has been subjected to OPC so that the critical dimension of the corresponding end portion of the gate line defined by the gate line pattern 320 is not overly reduced, and has a contour approximately similar to the calculated projection contour 32. It is noted that the left lower gate line pattern 320a has a larger OPC pattern at its end for exemplifying the way to repair the failed contact hole pattern.

Before the repair procedure, four serifs are added to four corners of each contact hole pattern 300(*a*) in the OPC performed to the graphic data of the target photomask. In the subsequent process rule check, the projection contours 30(*a*) of all contact hole patterns 300(*a*) and projection contours 32(*a*) of all gate lines patterns 320 are derived through numerical integration, so as to check if there is any pair of contours 30 and 32 that are too close to provide a sufficient alignment/etching margin. The result of the check is that the calculated projection contour 30a of the central contact hole pattern 300a is too close to the calculated projection contour 32a of the left lower gate line pattern 320a, so that the central contact hole pattern 300a does not pass the process rule check and is a failed pattern.

Referring to FIGS. 3A and 3B, the OPC repair procedure of this embodiment is performed to the failed contact hole pattern 300a only. The upper patterned layer and the lower patterned layer, which are respectively on and under the patterned layer with S/D contact holes therein and related to the same, respectively include interconnect lines and active areas that are coupled via the contact plugs. Hence, the graphic data of the parts of the interconnect lines and the active areas corresponding to the contact hole pattern 300a that include an active area 310 and an interconnect line 330a are retrieved. Some other interconnect lines 330 near the interconnect line 330a corresponding to the other contact hole patterns 300 are also depicted for clarity.

Then, under the limitation that the overlap area of the contact plug corresponding to 300a with each of the active area 310 and interconnect line 330a connected thereto has to be within a certain range for sufficiently low resistance, the x-directional critical dimension of the contact hole pattern 300a is decreased and the center thereof shifted rightward slightly, so as to increase the distance between the projection contours 30a of the contact hole pattern 300a and that (32a) of the gate line pattern 320a and increase the alignment/etching margin thereby. Meanwhile, the y-directional critical dimension of the same is increased to maintain the cross-sectional area of the contact plug for sufficiently low conductance.

Moreover, the goal of this repair procedure may be that the distance (a) between the contour 30a and the contour 32 in any direction is equal to the distance (b) between the contour 32 and the contour 30 at the other side of the contour 32. To make the goal, the distances at all directions between the contour 30a of the contact hole pattern 300a and the contours 32(*a*) of the plurality of gate line patterns 320(*a*) have to be considered in the repair procedure. Moreover, in consideration of the lithographic resolution, the decrease in the x-directional critical dimension usually does not exceed 30% thereof, preferably 15% thereof. The increase in the y-directional critical dimension usually does not exceed 30% thereof, preferably 15% thereof. Consequently, an after-OPC and repaired contact hole pattern 300a' is obtained. Since the contact hole pattern 300a' is near rectangular, it has a near elliptic calculated projection contour 30a'.

Since the photomask manufacturing method of this invention performs a repair procedure only to the failed patterns not passing the process rule check but not adjust all patterns with another OPC recipe, the design of the photomask can be simplified to shorten the period needed for manufacturing the photomask.

Additionally, in the above embodiments where a critical dimension and/or a position of a failed pattern is adjusted in the repair procedure, the process margin is increased to improve the product yield.

This invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An integrated circuit, comprising:
a plurality of patterned layers and a plurality of contact plugs, wherein at least one contact plug among the plurality of contact plugs has an elliptic shape in a top view, the at least one contact plug having the elliptic shape in the top view comprises a pair of neighboring contact plugs each having the elliptic shape in the top view, and major axes of the elliptic shapes of the pair of neighboring contact plugs are oriented in the same direction.

2. The integrated circuit of claim 1, wherein the plurality of patterned layers includes an upper patterned layer and a lower patterned layer that are respectively over and under the at least one contact plug and both relate to the at least one contact plug.

3. The integrated circuit of claim 2, wherein the upper patterned layer and the lower patterned layer each comprises a plurality of conductive lines.

4. The integrated circuit of claim 3, wherein the at least one contact plug is connected with a first conductive line in the upper patterned layer and with a second conductive line in the lower patterned layer, and a major axis of the elliptic shape of the at least one contact plug is parallel or perpendicularly to the first conductive line or the second conductive line.

5. The integrated circuit of claim 2, wherein the at least one contact plug is located in a dielectric layer as a first patterned layer among the plurality of patterned layers, and the plurality of patterned layers also includes a second patterned layer at the same level of the at least one contact plug.

6. The integrated circuit of claim 5, wherein
the lower patterned layer includes a plurality of active areas,
the upper patterned layer includes a plurality of interconnect lines, and
the second patterned layer includes a plurality of gates.

7. The integrated circuit of claim 1, wherein the plurality of contact plugs further includes a circular contact plug, and the at least one contact plug having the elliptic shape in the top view has substantially the same area as the circular contact plug.

8. An integrated circuit, comprising a plurality of patterned layers and a plurality of contact plugs, wherein at least one first contact plug among the plurality of contact plugs has a center shift relative to at least one of
a part of an upper patterned layer over and relating to the at least one first contact plug, and
a part of a lower patterned layer under and relating to the at least one first contact plug,
wherein the part of the upper patterned layer and the part of the lower patterned layer each correspond to the at least one first contact plug in position.

9. The integrated circuit of claim 8, wherein the upper patterned layer and the lower patterned layer each comprises a plurality of conductive lines.

10. The integrated circuit of claim 8, wherein the at least one first contact plug is located in a dielectric layer as a first patterned layer among the plurality of patterned layers, and the plurality of patterned layers also includes a second patterned layer at the same level of the at least one first contact plug.

11. The integrated circuit of claim 8, wherein the plurality of contact plugs further includes a pair of neighboring second contact plugs each having an elliptic shape in a top view, and major axes of the elliptic shapes of the pair of neighboring second contact plugs are oriented in the same direction.

12. The integrated circuit of claim 8, wherein the plurality of contact plugs further includes a circular contact plug, and each of the second contact plugs has an area substantially the same as an area of the circular contact plug.

13. The integrated circuit of claim 8, wherein the plurality of contact plugs further includes at least one second contact plug that does not have a center shift relative to another part of the upper patterned layer or another part of the lower patterned layer, wherein the another part of the upper patterned layer and the another part of the lower patterned layer each correspond to the at least one second contact plug in position.

* * * * *